United States Patent
Khan et al.

(10) Patent No.: US 10,947,621 B2
(45) Date of Patent: Mar. 16, 2021

(54) LOW VAPOR PRESSURE CHEMICAL DELIVERY

(71) Applicant: Applied Materials, Inc., Santa Clara, CA (US)

(72) Inventors: Adib Khan, Cupertino, CA (US); Qiwei Liang, Fremont, CA (US); Srinivas D. Nemani, Sunnyvale, CA (US); Tobin Kaufman-Osborn, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 16/126,760

(22) Filed: Sep. 10, 2018

(65) Prior Publication Data

US 2019/0119813 A1 Apr. 25, 2019

Related U.S. Application Data

(60) Provisional application No. 62/575,843, filed on Oct. 23, 2017.

(51) Int. Cl.
| | |
|---|---|
| *C23C 16/455* | (2006.01) |
| *C23C 16/448* | (2006.01) |
| *C23C 16/44* | (2006.01) |
| *C07F 15/00* | (2006.01) |

(52) U.S. Cl.
CPC .... *C23C 16/45557* (2013.01); *C23C 16/4402* (2013.01); *C23C 16/4408* (2013.01); *C23C 16/4481* (2013.01); *C23C 16/45561* (2013.01); *C07F 15/0046* (2013.01)

(58) Field of Classification Search
CPC .......... C23C 16/4481; C23C 16/45561; C23C 16/4408; C23C 16/4402; C23C 16/45557; C07F 15/0046
See application file for complete search history.

(56) References Cited

U.S. PATENT DOCUMENTS

| | | | |
|---|---|---|---|
| 5,595,603 A | 1/1997 | Klinedinst et al. | |
| 2002/0192370 A1 | 12/2002 | Metzner et al. | |
| 2005/0257735 A1* | 11/2005 | Guenther | B01D 7/00 117/89 |
| 2006/0032444 A1* | 2/2006 | Hara | C23C 16/45525 118/715 |
| 2009/0061541 A1* | 3/2009 | Moriya | G05D 7/0658 438/10 |
| 2009/0214777 A1 | 8/2009 | Sarigiannis et al. | |
| 2010/0305884 A1 | 12/2010 | Yudovsky et al. | |

(Continued)

*Primary Examiner* — Yuechuan Yu
(74) *Attorney, Agent, or Firm* — Patterson + Sheridan, LLP

(57) ABSTRACT

A method and apparatus for delivering gases to a semiconductor processing system are provided. In some embodiments, the apparatus includes a gas inlet line having an inlet valve; a gas outlet line having an outlet valve; a gas flow controller arranged to control the flow through the inlet valve; an orifice contained within at least one of the gas outlet line, the outlet valve, a chemical ampoule outlet valve, or outlet isolation valve; a chemical ampoule fluidly coupled to at least one of the gas inlet line and the gas outlet line; and a processing chamber. In some embodiments, the apparatus further includes a check valve, one or more orifices, and/or a heated divert line.

20 Claims, 3 Drawing Sheets

(56) References Cited

U.S. PATENT DOCUMENTS

2013/0019960 A1* 1/2013 Choi .................. C23C 16/4481
  137/334
2015/0299858 A1 10/2015 Yudovsky et al.
2016/0097127 A1 4/2016 Lenz

* cited by examiner

LOW VAPOR PRESSURE CHEMICAL DELIVERY

CROSS REFERENCE TO RELATED APPLICATIONS

This application claims benefit of U.S. Provisional Patent Application No. 62/575,843, filed Oct. 23, 2017, the entirety of which is herein incorporated by reference.

BACKGROUND

Field

Embodiments of the present invention generally relate to a method and apparatus for delivering gases to a semiconductor processing system. Specifically, embodiments of the present disclosure are directed to methods and apparatus to improve precursor delivery to the substrate processing chamber.

SUMMARY

Vapor deposition processes that utilize solid precursors, including low vapor pressure chemical delivery, may suffer several problems. For example, undesirable temperature differences along the gas input and output lines leads to severe chemical condensation in those lines. Additionally, initial delivery spikes of the gas and unstable flows of gas during substrate processing exist. The combination of temperature and pressure variances leads to non-repeatability and non-uniformity in deposition on the substrate. However, processing of substrates requires precise control of temperature, flow rate, and pressure in the delivery of gases used during processing.

In an embodiment, an apparatus for delivering gases to a semiconductor processing system is provided. The apparatus includes a gas inlet line having an inlet valve; a gas outlet line having an outlet valve; a gas flow controller arranged to control the flow through the inlet valve; an orifice contained within at least one of the gas outlet line, the outlet valve, a chemical ampoule outlet valve, or outlet isolation valve; a chemical ampoule fluidly coupled to at least one of the gas inlet line and the gas outlet line; and a processing chamber.

In another embodiment, an apparatus for delivering gases to a semiconductor processing system is provided. The apparatus includes a gas inlet line having an inlet valve; a gas outlet line having an outlet valve; a gas flow controller arranged to control the flow through the inlet valve; an orifice fluidly coupled to the outlet valve, the gas outlet line, or a combination thereof; a processing chamber; a hot can; a check valve fluidly connected to the gas inlet line; a chemical ampoule in fluid communication with the hot can; a third outlet valve coupled to the gas outlet line and a heated divert line by-passing the processing chamber, wherein the processing chamber is coupled to the gas outlet line; and a fourth outlet valve in fluid communication with the gas outlet line, allowing a flow of chemical precursor and/or carrier gas from the chemical ampoule to the processing chamber.

In another embodiment, an apparatus for delivering gases to a semiconductor processing system is provided. The apparatus includes a gas inlet line having an inlet valve; a gas outlet line having an outlet valve; a gas flow controller arranged to control a flow through the inlet valve; a processing chamber; a hot can; a check valve fluidly connected to the gas inlet line; an orifice fluidly coupled to the outlet valve, gas outlet line, or a combination thereof; a chemical ampoule in fluid communication with the hot can; a third outlet valve coupled to the gas outlet line and a heated divert line by-passing the processing chamber, wherein the processing chamber is coupled to the gas outlet line; a fourth outlet valve in fluid communication with the gas outlet line, allowing a flow of chemical precursor and/or carrier gas from the chemical ampoule to the processing chamber; and a calibration circuit coupled to the outlet valve.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure are directed to apparatus and methods to improve chemical delivery from a chemical ampoule to a processing chamber.

Severe chemical condensation has been observed in gas delivery lines of conventional processing systems (or apparatus) that utilize chemical ampoules. In a conventional apparatus 100 illustrated by FIG. 1, large temperature ranges exist along the chemical delivery lines, for example, between about 91° C. and about 180° C. The condensation leads to chemical delivery issues, particles on the wafer, non-uniformity, and a first wafer effect during back-to-back wafer runs. The inventors have discovered that these problems can be addressed by uniform delivery line heating, maintaining a temperature gradient, and a heated carrier line.

Figure 2:
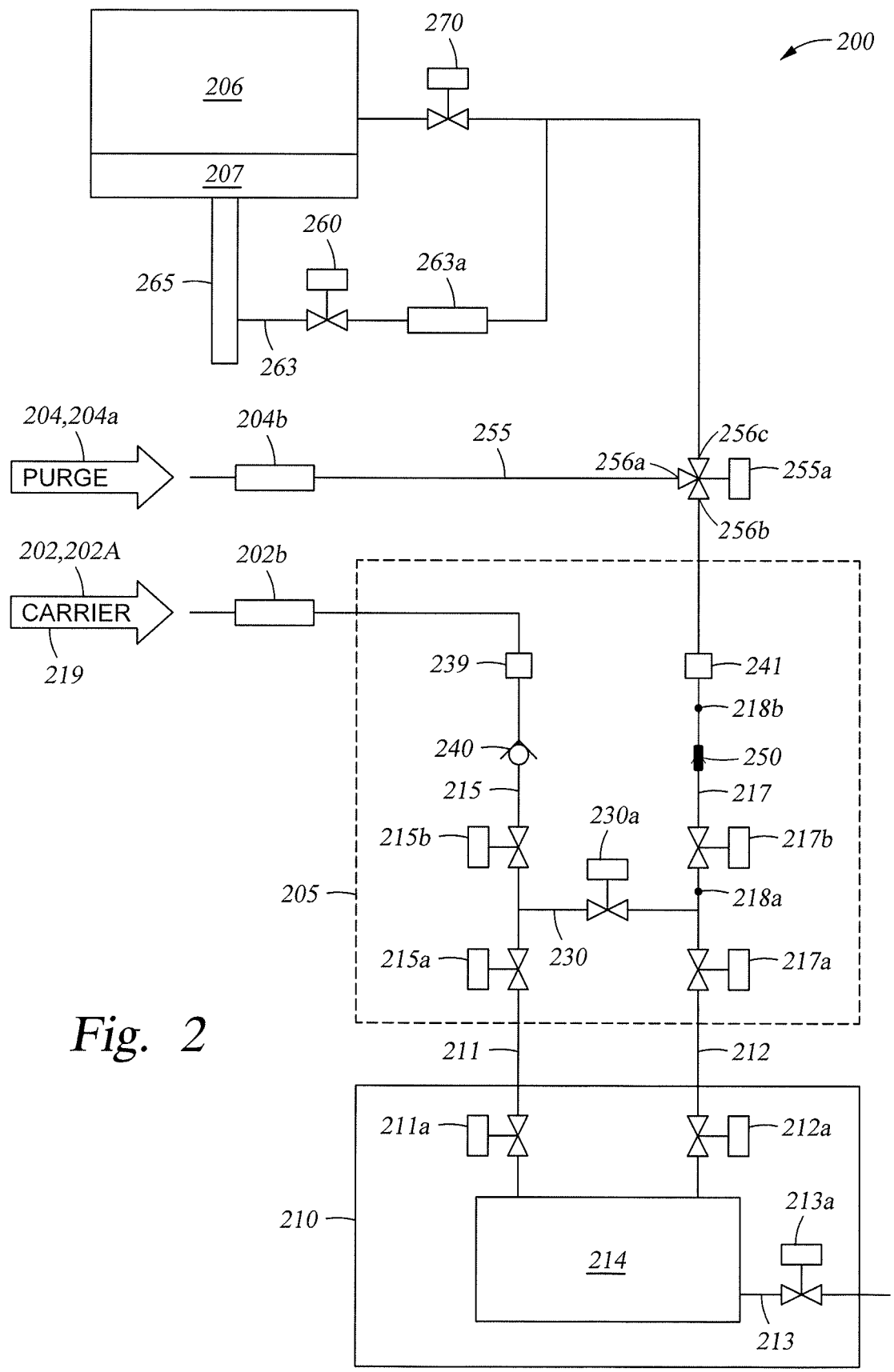
FIG. 2 shows a schematic of a chemical delivery system.

The conventional apparatus 100 also exhibits undesirable high-pressure delivery spikes and unstable flows of gases during the initial stages of substrate processing. This results in inconsistent flux of precursor into chamber as well as unstable pressure in chamber during steady state dosing conditions demonstrating unstable chemical delivery. The inventors have discovered that adding an orifice in the delivery line as shown in the novel process chemical delivery system (or apparatus) 200 depicted in FIG. 2 provides a solution to the aforementioned problems. The orifice can be used with or without a heated divert line and a check valve. Use of the orifice reduces the initial spike with the fully open valve and controls the flow of gases. Use of the heated divert line and check valve may aid in dispersing any initial spikes of gas and stabilizing the flow of gases from the chemical ampoule to the processing chamber. A main purpose of the check valve is to prevent precursor back streaming up the gas inlet line. Additionally, the check valve can provide an additional tool to keep the precursor in the hot can so the precursor cannot inadvertently condense in the carrier gas line.

Figure 1:
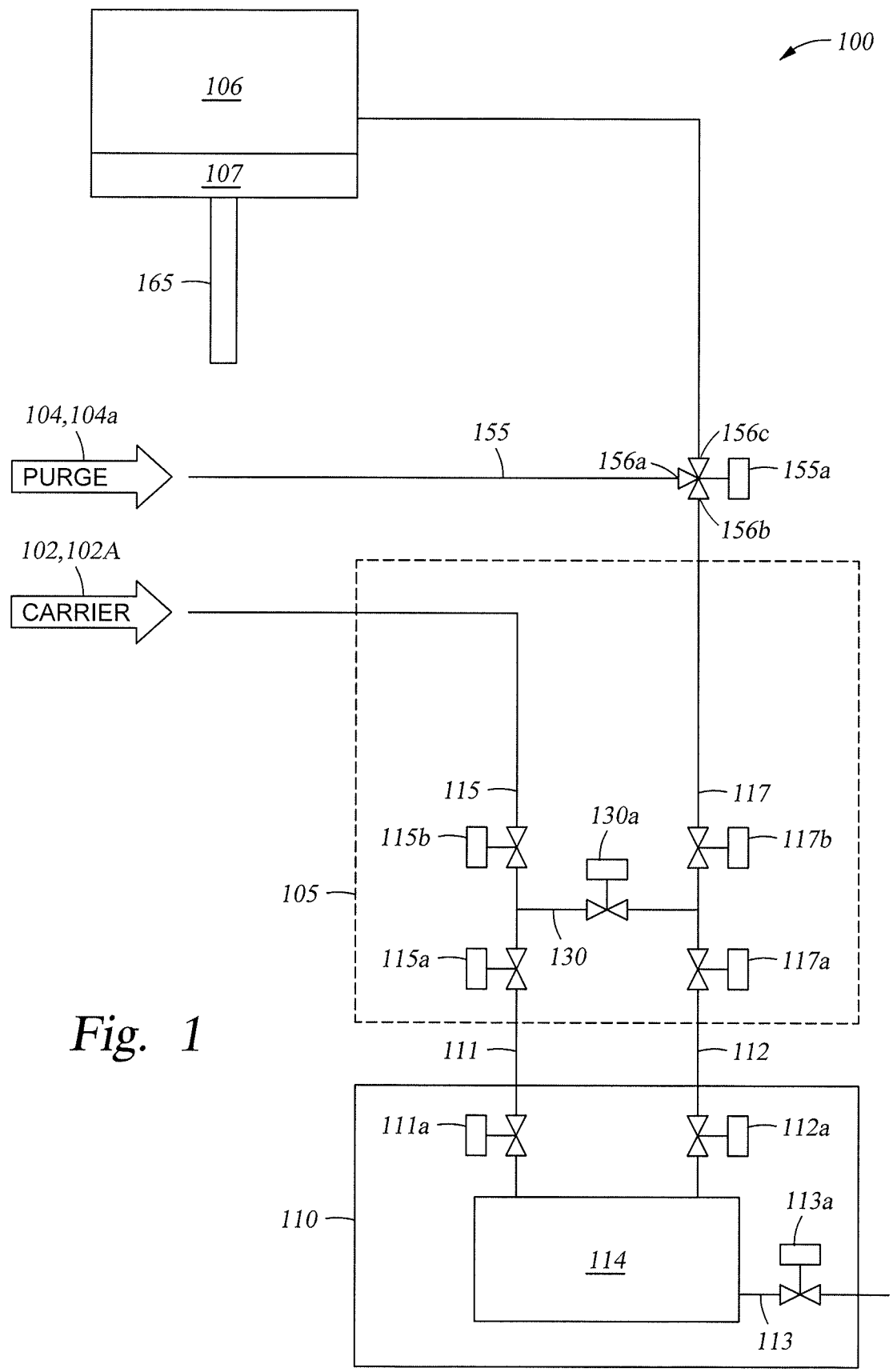
FIG. 1 shows a schematic of a conventional chemical delivery system.

FIG. 1 shows a schematic of a conventional processing chemical delivery system (or conventional apparatus) 100. The conventional apparatus 100 includes a processing chamber 106, a pedestal 107, a carrier gas source 102a, a purge gas source 104a, and a chemical ampoule 110. The processing chamber 106 may be a chamber to conduct thermal deposition processes or vapor deposition processes containing a vaporized chemical precursor.

The chemical ampoule 110 includes an ampoule inlet 111 and an ampoule outlet 112, and can also include an additional conduit 113 that is in fluid communication with the interior volume of the chemical ampoule 110. The optional conduit 113 may include an isolation valve 113a and can be used to pressurize or depressurize the chemical ampoule 110.

The chemical ampoule 110 includes an interior body 114, and the interior body 114 can store chemical precursors. The ampoule inlet 111 may include an inlet isolation valve 111a to isolate the ampoule inlet 111 from the outside environment when the chemical ampoule 110 is not connected. Similarly, the ampoule outlet 112 may include an outlet isolation valve 112a to isolate the ampoule outlet 112 from the outside environment when the chemical ampoule 110 is not connected. The inlet isolation valve 111a and the outlet isolation valve 112a can be opened to allow fluid communication with an interior volume of the chemical ampoule 110.

The apparatus 100 includes a gas inlet line 115 in fluid communication with a carrier gas 102 or a carrier gas source 102a. The carrier gas source 102a may be heated by carrier gas heater 102b. The gas inlet line 115 has an ampoule inlet valve 115a and an isolation inlet valve 115b to control the flow of the carrier gas 102 into the chemical ampoule 110. The apparatus 100 includes a gas outlet line 117 comprising an ampoule outlet valve 117a and an isolation outlet valve 117b to control the flow of, e.g., the precursor vapor and carrier gas that leaves the chemical ampoule 110. A bypass line 130 connects the gas inlet line 115 and the gas outlet line 117. The bypass line 130 comprises a bypass valve 130a downstream of the ampoule outlet valve 117a when a chemical ampoule 110 is present. The bypass valve 130a allows carrier gas 102 to flow from the gas inlet line 115 to purge the gas outlet line 117 without flowing carrier gas 102 into the chemical ampoule 110. For example, when there is no chemical ampoule 110 present, the bypass valve 130a can be open to allow the flow of carrier gas 102. The bypass line 130 and bypass valve 130a of some embodiments is upstream of the ampoule inlet valve 115a. In some embodiments, the bypass line 130 connects to the gas inlet line 115 downstream of the ampoule inlet valve 115a. In some embodiments, the bypass line 130 and bypass valve 130a are in communication with the gas outlet line 117 downstream of the ampoule outlet valve 117a. In some embodiments, the bypass line 130 connects to the gas outlet line 117 upstream of the ampoule outlet valve 117a. In some embodiments, the bypass line 130 connects to and is in fluid communication with the gas inlet line 115 upstream of the ampoule inlet valve 115a and connects to and is in fluid communication with the gas outlet line 117 downstream of the ampoule outlet valve 117a. In some embodiments, the bypass line 130 connects to and is in fluid communication with the gas inlet line 115 downstream of the ampoule inlet valve 115a and connects to and is in fluid communication with the gas outlet line 117 upstream of the ampoule outlet valve 117a.

The apparatus 100 includes a purge line 155 in fluid communication with a purge gas 104 and/or a purge gas source 104a. The purge gas source may be heated by purge gas heater 104b. The purge line 155 comprises a purge outlet valve 155a in fluid communication with the purge line 155 to allow a flow of the purge gas 104 to the processing chamber 106. In some embodiments, the purge outlet valve 155a comprises a first input 156a in fluid communication with the purge line 155 and a second input 156b in fluid communication with the gas outlet line 117. The purge outlet valve 155a may also include a first outlet 156c to direct the flow toward the processing chamber 106. In some embodiments, the purge outlet valve 155a is a three-way valve or proportioning valve which can pass the flow from only one of the gas outlet line 117 and the purge line 155 to the processing chamber 106 or can mix the flow from the gas outlet line 117 and the purge line 155. The mixed flow can range from entirely the gas outlet line 117 to entirely the purge line 155 and all states in-between.

A hot can 105 (indicated by the dashed lines) surrounds a portion of the gas inlet line 115 and gas outlet line 117 in order to ensure a uniform temperature gradient along the gas delivery system, heats the valves in the delivery line, and aids in preventing deposition of impurities that can ruin a substrate. The hot can 105 is a housing used to contain and retain heat on the components within the hot can 105. The heater can be inside or outside the housing. The components can be heated by, for example, forced hot air, cartridge heaters, resistive heaters, and heated wraps.

The variations in pressure and heat, and chemical condensation within the conventional apparatus 100 cause inconsistent flux of the precursor gas into the chamber and unstable chemical delivery such that processes are non-repeatable and substrate processing is non-uniform. Thus, the addition of mechanisms to minimize the variations in pressure and heat, and the chemical condensation is needed. As described below in the novel system illustrated in FIG. 2, the orifice, among other components, allows for controlled chemical vapor delivery and stable vapor pressure for each run.

FIG. 2 shows a schematic of a novel process chemical delivery system 200. The novel process chemical delivery system (or apparatus) 200 includes a processing chamber 206, a pedestal 207, a carrier gas source 202a (which is optionally heated), a purge gas source 204a (which is optionally heated), and a chemical ampoule 210. Processing chamber 206 may be a chamber to conduct thermal deposition processes or vapor deposition processes containing a vaporized chemical precursor. Processing chamber 206 is generally a chemical vapor deposition (CVD) chamber, an atomic layer deposition (ALD) chamber, or can be a derivative thereof.

The apparatus 200 has a chemical ampoule 210. In an embodiment, the chemical ampoule 210 may be used with apparatus 200. In another embodiment, the chemical ampoule 210 may not be part of apparatus 200. The chemical ampoule 210 may be any ampoule used for delivery of any low vapor pressure precursors, for example, a sublimation ampoule or an evaporation ampoule. The chemical ampoule 210 can comprise any form of precursor suitable for use for a deposition process. In some embodiments, the chemical ampoule 210 comprises one or more solid precursors. In some embodiments, the chemical ampoule 210 comprises one or more liquid precursors. In some embodiments, the chemical ampoule 210 comprises one or more solid precursors and one or more liquid precursors. In some embodiments, chemical ampoule 210 includes an interior body 214, and the interior body 214 can store precursors.

The chemical ampoule 210 includes an ampoule inlet 211 and an ampoule outlet 212, and can also include an additional conduit 213 that is in fluid communication with the interior volume of the chemical ampoule 210. The optional conduit 213 may include an isolation valve 213a and can be used to pressurize or depressurize the chemical ampoule 210. The ampoule inlet 211 may include an inlet isolation valve 211a to isolate the ampoule inlet 211 from the outside environment when the chemical ampoule 210 is not connected. Similarly, the ampoule outlet 212 may include an outlet isolation valve 212a to isolate the ampoule outlet 212 from the outside environment when the chemical ampoule 210 is not connected. The inlet isolation valve 211a and the outlet isolation valve 212a can be opened to allow fluid communication with an interior volume of the chemical ampoule 210.

The apparatus 200 includes a gas inlet line 215 in fluid communication with a carrier gas 202 or a carrier gas source 202a. The carrier gas source 202a may be heated by carrier gas heater 202b. The gas inlet line 215 has an ampoule inlet valve 215a and an isolation inlet valve 215b to control the flow of the carrier gas 202 into chemical ampoule 210. The apparatus 200 includes a gas outlet line 217 comprising an ampoule outlet valve 217a and an isolation outlet valve 217b to control the flow of, e.g., the precursor vapor and carrier gas 202 that leaves the chemical ampoule 210. A bypass line 230 connects the gas inlet line 215 and the gas outlet line 217. The bypass line 230 comprises a bypass valve 230a downstream of the ampoule outlet valve 217a when a chemical ampoule 210 is present. The bypass valve 230a allows the carrier gas 202 to flow from the gas inlet line 215 to purge the gas outlet line 217 without flowing carrier gas 202 into the chemical ampoule 210. For example, when there is no chemical ampoule 210 present, the bypass valve 230a can be open to allow the flow of the carrier gas 202. The bypass line 230 and the bypass valve 230a of some embodiments are upstream of the ampoule inlet valve 215a. In some embodiments, the bypass line 230 connects to the gas inlet line 215 downstream of the ampoule inlet valve 215a. In some embodiments, the bypass line 230 and the bypass valve 230a are in communication with the gas outlet line 217 downstream of the ampoule outlet valve 217a. In some embodiments, the bypass line 230 connects to the gas outlet line 217 upstream of the ampoule outlet valve 217a. In some embodiments, the bypass line 230 connects to and is in fluid communication with the gas inlet line 215 upstream of the ampoule inlet valve 215a and connects to and is in fluid communication with the gas outlet line 217 downstream of the ampoule outlet valve 217a. In some embodiments, the bypass line 230 connects to and is in fluid communication with the gas inlet line 215 downstream of the ampoule inlet valve 215a and connects to and is in fluid communication with the gas outlet line 217 upstream of the ampoule outlet valve 217a.

The gas inlet line 215 can be coupled to an inlet calibration circuit 239 that is configured to accurately measure the gas flow. The inlet calibration circuit 239 may be utilized to perform flow verification of the system components, while not requiring flow into the processing chamber 206. The gas inlet line 215 may be coupled to a check valve 240. A main purpose of the check valve 240 is to prevent precursor back streaming up the gas inlet line 215. Additionally, the check valve 240 can provide an additional tool to keep the precursor in the hot can 205 (indicated by the dashed lines) so that the precursor cannot inadvertently condense in the carrier gas line. The inlet calibration circuit 239 may be upstream or downstream of the check valve 240.

In one embodiment, the inlet calibration circuit 239 includes a gas source, a diverter valve, a regulating device and a sensing circuit. The sensing circuit is configured to receive the flow of gases passing through the inlet and outlet valves. In another embodiment, the inlet calibration circuit 239 utilizes a calibrated volume for receiving the gas flow. From properties and/or attributes measured from the gas in the calibrated volume, the flow rate and/or pressure of the gas entering the sensing circuit may be verified. In another embodiment, the inlet calibration circuit 239 utilizes a non-calibrated volume for receiving the gas flow. From changes in the properties and/or attributes measured over time of the gas in the non-calibrated volume, the flow rate and/or pressure of the gas entering the sensing circuit may be verified. In yet another embodiment, the inlet calibration circuit 239 includes a vibrating member disposed in a calibrated volume. In other embodiments, the inlet calibration circuit 239 may include a sensor configured to detect at least one of electrical or magnetic characteristics of gases disposed in the calibrated volume. Thus, the inlet calibration circuit 239 is configured for calibrating an effective open area of the valves by measuring flow through the ampoule inlet valve 215a and ampoule outlet valve 217a while flow is being maintained through the ampoule inlet valve 215a and the ampoule outlet valve 217a.

The gas outlet line 217 can be coupled to an outlet calibration circuit 241 that is configured to accurately measure gas flow. The outlet calibration circuit 241 may be utilized to perform flow verification of the system components, while not requiring flow into the processing chamber 206. In such cases, the outlet calibration circuit 241 is configured to calibrate the area of the orifice 250 by measuring flow through the orifice while flow is maintained through the connecting valves (and in such cases is an orifice calibration circuit). The gas outlet line 217 includes an orifice 250 sized to provide a chocked flow condition. Establishing a chocked flow condition minimizes spikes of pressure of gases sweeping into the processing chamber 206. The orifice 250 may be made of any material that is compatible with the chemicals and byproducts found in substrate processing systems. The orifice 250 is sized to fit the gas outlet line 217. The orifice 250 creates flow conditions in the gas outlet line 217 similar to conditions present when the gases are flowing into the processing chamber 206. The size of the orifice 250 may be determined by experimentation, empirical analysis or by other suitable method. In some embodiments, the size of the orifice 250 may be determined by measuring the pressure downstream of the orifice 250 and adjusting the size of the orifice 250 until a desired pressure is realized. In some embodiments, one or more orifices are fluidly coupled to a respective one of the outlet valves, gas outlet lines, or a combination of both.

The apparatus 200 may include at least one sensor 218a/218b along the gas outlet line 217 arranged to provide a metric of at least one of flow, pressure or chemistry from gas exiting at least one of the outlet valves. The apparatus 200 may include a gas flow controller 219 configured to adjust a characteristic of a gas flowing within at least one of the gas input lines in response to the metric provided to the gas flow controller 219 by the at least one sensor 218a/218b.

The apparatus 200 includes a purge line 255 in fluid communication with a purge gas 204 and/or a purge gas source 204a. The purge gas source 204a may be heated by purge gas heater 204b. The purge line 255 comprises a purge outlet valve 255a in fluid communication with the purge line 255 to allow a flow of a purge gas 204 to the processing chamber 206. In some embodiments, the purge outlet valve 255a comprises a first input 256a in fluid communication with the purge line 255 and a second input 256b in fluid communication with the gas outlet line 217. The purge outlet valve 255a may also include a first outlet 256c to direct the flow toward the processing chamber 206. In some embodiments, the purge outlet valve 255a is a three-way valve or proportioning valve which can pass the flow from only one of the gas outlet line 217 and the purge line 255 to the processing chamber 206 or can mix the flow from the gas outlet line 217 and the purge line 255. The mixed flow can range from entirely the gas outlet line 217 to entirely the purge line 255 and all states in between.

In the embodiment depicted in FIG. 2, the apparatus 200 includes a hot can 205 (indicated by the dashed lines). The orifice 250 of the present disclosure is interfaced with the gas outlet line 217 extending between the hot can and the processing chamber. The check valve 240 of the present disclosure is interfaced with the gas inlet line 215 extending between the hot can 205 and enveloped by the hot can 205. The hot can 205 ensures a uniform temperature gradient along at least a portion of the apparatus 200 (by, e.g., surrounding a portion of the gas inlet line 215 and the gas outlet line 217), uniformly heats the valves, and aids in preventing deposition of impurities that can ruin a substrate. Further discussion of the hot can is described above. In some embodiments, the orifice 250 and/or the check valve 240 may be outside of the hot can 205. In such cases, gas heaters along the gas inlet line 215 and the gas outlet line 217 can be used to elevate the temperature of the gas flowing through the respective line so that it does not cause the vapor to condense in the lines.

In some embodiments, the apparatus includes an orifice 250, a check valve 240, a divert line 263 (which can be heated), or a combination thereof.

In some embodiments, a heated divert line is used. As shown in FIG. 2, a third outlet valve 260 in fluid communication with the gas outlet line 217 allows the flow of, e.g., a chemical precursor and/or a carrier gas from the chemical ampoule 210 to be directed to an exhaust line (foreline) 265 via a divert line 263, bypassing the processing chamber 206. The divert line may be heated by divert line heater 263a. In some embodiments, a third outlet valve 260 is coupled to the gas outlet line 217 and a heated divert line by-passing the processing chamber 206, wherein the processing chamber 206 is connected to the gas outlet line 217. In some embodiments, the third outlet valve 260 is downstream of the bypass line 230 in fluid communication with the gas outlet line 217. This configuration allows the gas to be directed to the foreline 265 when there is a chemical ampoule 210 present or when there is no chemical ampoule 210 present. In one or more embodiments, the third outlet valve 260 is upstream of the bypass line 230 and in fluid communication with the gas outlet line 217.

A fourth outlet valve 270 in fluid communication with the gas outlet line 217 allows the flow of a chemical precursor and/or a carrier gas from the chemical ampoule 210 to be directed to the processing chamber 206. In some embodiments, the fourth outlet valve 270 is downstream of the bypass line 230 in fluid communication with the gas outlet line 217. This configuration allows the gas to be directed to the processing chamber 206 when there is a chemical ampoule 210 present or when there is no chemical ampoule 210 present. In one or more embodiments, the fourth outlet valve 270 is upstream of the bypass line 230 and in fluid communication with the gas outlet line 217.

As discussed with the apparatus of FIG. 2, there are multiple zones for temperature control, rather than a mere single zone temperature control, e.g., the hot can. Utilization of multiple zones of temperature control allows for less condensation and chemical residue along the lines of the chemical delivery apparatus. The minimum and maximum temperature along the lines for the conventional apparatus (single zone temperature control) is 91.6° C. and 179.41° C., respectively. For the new apparatus disclosed herein, the minimum and maximum temperature along the lines is 154° C. and 160° C., respectively.

The chemical ampoule 210 includes an interior body 214. For reasons of chemical compatibility and mechanical strength, interior body 214 is typically made of a stainless steel, such as 316 stainless steel (316 SST). The material of interior body 214 should be fairly chemically inert since different types of chemical precursors, such as highly reactive materials, may be stored within interior body 214. Substantial mechanical strength is a desirable characteristic for interior body 214 of chemical ampoule 210. In some embodiments, interior body 214 may be operated at below atmospheric pressure during processes and may be pressurized above atmospheric pressure for transport and storage. Hence, interior body 214 must act as a reliable containment vessel for a toxic chemical precursor while utilized as a vacuum chamber or as a pressure vessel.

Undesirable thermal gradients may develop inside interior body 214 during use because 316 SST is a poor medium for thermal conductivity. For example, when a liquid chemical precursor is contained inside the interior body 214, more volume of the interior body 214 is vapor-filled as the liquid precursor is depleted, poor thermal conductivity of the interior body 214 may result in uneven heating (e.g., hot spots) within the liquid precursor later in the life of the ampoule. In another example, such as when the interior body 214 contains a solid chemical precursor, poor thermal conductivity of the interior body 214 may create hot spots throughout the life of the ampoule. In either case, a CVD process or an ALD process may be detrimentally affected by such temperature non-uniformities.

Solid chemical precursors may be used to form process gases include tantalum precursors, such as pentakis(dimethylamido) tantalum (PDMAT; $Ta(NMe_2)_5$), pentakis(diethylamido) tertiaryamylimido-tris(dimethylamido) tantalum (TAIMATA, $(t-AmylN)Ta(NMe_2)_3$, wherein t-Amyl is the tertiary amyl group ($C_5H_{11}$ or $—CH_3CH_2C(CH_3)_2—$), or derivatives thereof. In one embodiment, the PDMAT has a low halogen content (e.g., Cl, F, I, or Br). The PDMAT may have a halogen concentration of less than about 100 ppm. For example, the PDMAT may have a chlorine concentration of less than about 100 ppm, preferably, less than about 20 ppm, more preferably, less than about 5 ppm, and more preferably, less than about 1 ppm, such as about 100 ppb or less.

Other solid chemical precursors that may be used to form process gases through a sublimation process include hafnium tetrachloride ($HfCl_4$), xenon difluoride, nickel carbonyl, and tungsten hexacarbonyl, or derivatives thereof. In other embodiments, liquid chemical precursors may be evaporated to form process gases within ampoules described herein. Other chemical precursors that may be used to form process gases include tungsten precursors, such as tungsten hexafluoride ($WF_6$), tantalum precursors, such as tantalum (PDEAT; $Ta(NEt_2)_5$), pentakis(methylethylamido) tantalum (PMEAT; $Ta(NMeEt)_5$), tertbutylimino-tris(dimethylamino) tantalum (TBTDMT, $t-BuNTa(NMe_2)_3$), tertbutylimino-tris (diethylamino) tantalum (TBTDET, $t-BuNTa(NEt_2)_3$), tertbutylimino-tris(methylethylamino) tantalum (TBTMET, t-BuNTa(NMeEt)$_3$), or derivatives thereof, titanium precursors, such as titanium tetrachloride (TiCl$_4$), tetrakis(dimethylamino) titanium (TDMAT, (Me$_2$N)$_4$Ti)), tetrakis(diethylamino) titanium (TEMAT, (Et$_2$N)$_4$Ti)), or derivatives thereof, ruthenium precursors, such as bis(ethylcyclopentadienyl) ruthenium ((EtCp)$_2$Ru), hafnium precursors, such as tetrakis(dimethylamino) hafnium (TDMAH, (Me$_2$N)$_4$Hf)), tetrakis(diethylamino) hafnium (TDEAH, (Et$_2$N)$_4$Hf)), tetrakis(methylethylamino) hafnium (TMEAH, (MeEtN)$_4$Hf)), or derivatives thereof, and aluminum precursors, such as 1-methylpyrolidrazine:alane (MPA, MeC$_4$H$_3$N:AlH$_3$), pyridine:alane (C$_4$H$_4$N:AlH$_3$), alkylamine:alane complexes (e.g., trimethylamine:alane (Me$_3$N:AlH$_3$), triethylamine:alane (Et$_3$N:AlH$_3$), dimethylethylamine:alane (Me$_2$EtN: AlH$_3$)), trimethylaluminum (TMA, Me$_3$Al), triethylaluminum (TEA, Et$_3$Al), tributylaluminum (Bu$_3$Al), dimethylaluminum chloride (Me$_2$AlCl), diethylaluminum chloride (Et$_2$AlCl), dibutylaluminum hydride (Bu$_2$AlH), dibutylaluminum chloride (Bu$_2$AlCl), or derivatives thereof. In one or more embodiments, the precursor is hafnium tetrachloride.

The purge gas can be any suitable purge gas known in the art. Suitable purge gases include, but are not limited to, helium, nitrogen, neon, argon, krypton and xenon. In some embodiments, the purge gas is nitrogen.

Figure 3:
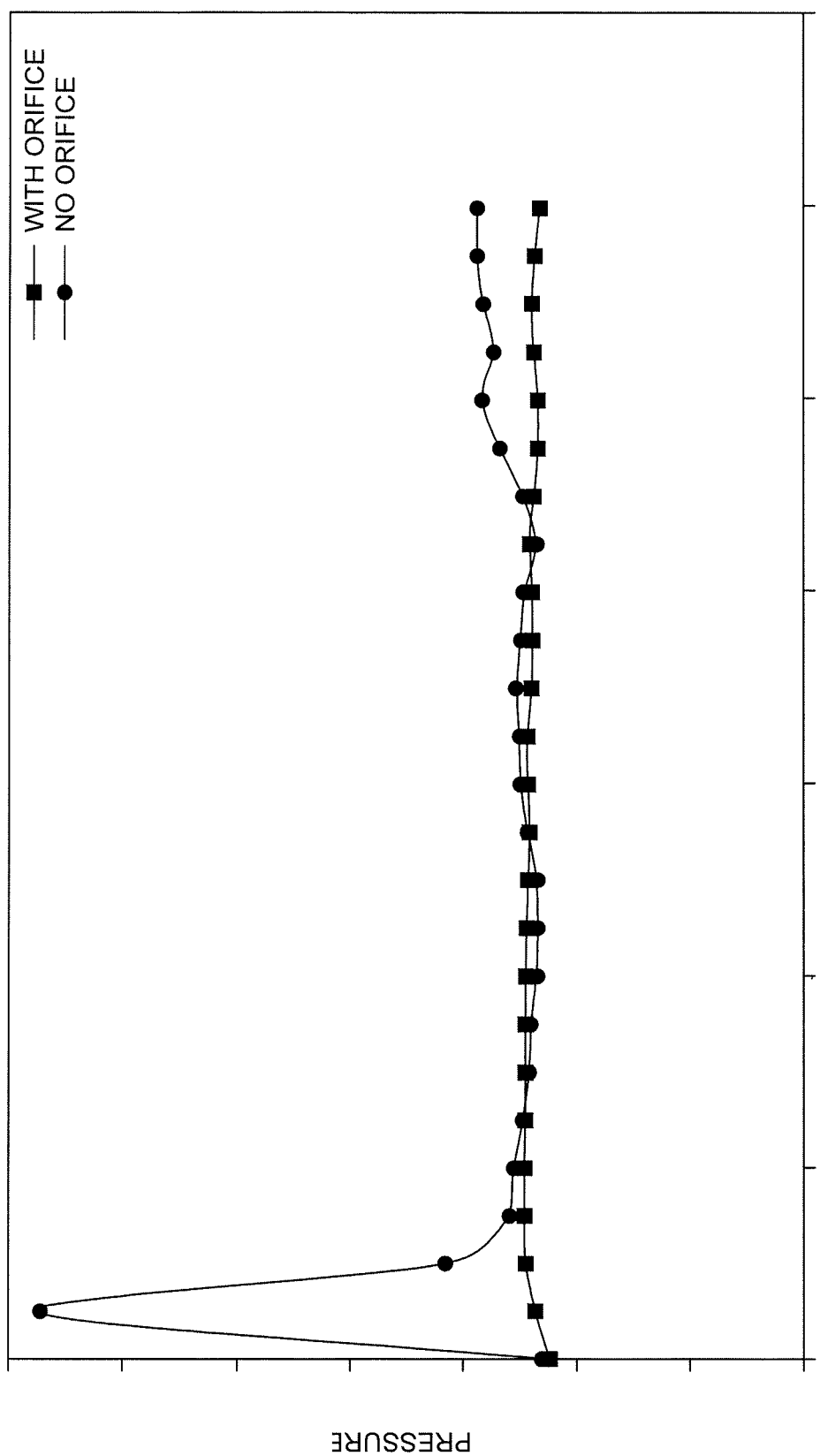
FIG. 3 shows a plot of pressure versus time for the chemical delivery system with and without an orifice.

Superior chemical delivery is achieved by adding an orifice to the chemical delivery system, with or without additional elements such as the heated divert line and/or check valve. FIG. 3 is a performance comparison between of the chemical delivery with and without these features. The added features mitigate the initial pressure spike, and allow for a gradual increase of precursor flux into the chamber. Additionally, the stable pressure in the chamber during steady state dosing conditions demonstrates stable chemical delivery.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An apparatus for delivery of a gas to a semiconductor processing system, comprising:
   a gas inlet line having an inlet valve coupled to a chemical ampoule inlet of a chemical ampoule;
   a gas outlet line having an outlet valve disposed downstream of a chemical ampoule outlet valve, and an outlet isolation valve disposed downstream of the outlet valve;
   a gas flow controller arranged to control flow through the inlet valve;
   an orifice sized to fit and be contained within the gas outlet line downstream of the outlet isolation valve, wherein the area of the orifice is sized to provide a choked flow through the gas outlet line; and
   an orifice calibration circuit coupled to the gas outlet line downstream of a sensor, wherein the sensor is disposed downstream of the orifice.

2. The apparatus of claim 1 further comprising a check valve within the gas inlet line.

3. The apparatus of claim 1 wherein the sensor is arranged to provide a metric of at least one of flow, pressure, or chemistry from gas exiting the outlet valve.

4. The apparatus of claim 3 further comprising a controller configured to adjust a characteristic of a gas flowing within the gas inlet line in response to the metric provided to the controller by the sensor.

5. The apparatus of claim 3 further comprising a third outlet valve coupled to the gas outlet line and a heated divert line by-passing the chemical ampoule, wherein a processing chamber is coupled to the gas outlet line.

6. The apparatus of claim 5 further comprising a fourth outlet valve in fluid communication with the gas outlet line, allowing the flow of a chemical precursor and/or a carrier gas from the chemical ampoule to a processing chamber.

7. The apparatus of claim 1, wherein the chemical ampoule is a sublimation ampoule, an evaporation ampoule, or a combination thereof.

8. The apparatus of claim 1 further comprising a purge line comprising a purge outlet valve in fluid communication with the purge line to flow a purge gas to a processing chamber.

9. The apparatus of claim 8 further comprising a calibration circuit configured for calibrating an effective open area of a valve by measuring a flow through the inlet valve and outlet valve while the flow is maintained through the inlet valve and outlet valve.

10. The apparatus of claim 1, wherein the orifice calibration circuit is configured to calibrate an area of the orifice by measuring a flow through the orifice while the flow is maintained through the inlet valve and the outlet valve.

11. The apparatus of claim 1, further comprising a check valve fluidly connected to the gas inlet line upstream of the chemical ampoule inlet.

12. An apparatus for delivery of a gas to a semiconductor processing system, comprising:
    a gas inlet line having an inlet valve coupled to a chemical ampoule;
    a gas outlet line having one or more of an outlet valve, a chemical ampoule outlet valve, or an outlet isolation valve for coupling the chemical ampoule to a processing chamber;
    a gas flow controller arranged to control flow through the inlet valve;
    an orifice fluidly coupled to the outlet valve, the gas outlet line, or a combination thereof;
    a hot can in fluid communication with the chemical ampoule;
    a check valve fluidly connected to the gas inlet line upstream of the chemical ampoule;
    a third outlet valve coupled to the gas outlet line and a heated divert line by-passing the chemical ampoule, wherein the processing chamber is coupled to the gas outlet line; and
    a fourth outlet valve in fluid communication with the gas outlet line, allowing a flow of chemical precursor and/or carrier gas from the chemical ampoule to the processing chamber.

13. The apparatus of claim 12 further comprising a sensor arranged to provide a metric of at least one of flow, pressure, or chemistry from gas exiting the outlet valve.

14. The apparatus of claim 13 further comprising a controller configured to adjust a characteristic of a gas flowing within the gas inlet line in response to the metric provided to the controller by the sensor.

15. The apparatus of claim 12, wherein the chemical ampoule is a sublimation ampoule, an evaporation ampoule, or a combination thereof.

16. The apparatus of claim 12 further comprising a calibration circuit coupled to the gas outlet line.

17. The apparatus of claim 12 further comprising a purge line comprising a purge outlet valve in fluid communication with the purge line to flow a purge gas to the processing chamber.

18. An apparatus for delivery of a gas to a semiconductor processing system, comprising: a gas inlet line having an inlet valve coupled to a chemical ampoule; a gas outlet line having a first outlet valve coupled to the chemical ampoule and a process chamber; a gas flow controller arranged to control flow through the inlet valve; a hot can in fluid communication with the chemical ampoule; a check valve fluidly connected to the gas inlet line upstream of a heated divert line by-passing the chemical ampoule; an orifice fluidly coupled to the first outlet valve, gas outlet line, or a combination thereof; a second outlet valve coupled to the gas outlet line and the heated divert line; a third outlet valve in fluid communication with the gas outlet line, allowing a flow of chemical precursor and/or carrier gas from the chemical ampoule to the processing chamber; and a calibration circuit coupled to the first outlet valve.

19. The apparatus of claim 18, further comprising a sensor arranged to provide a metric of at least one of flow, pressure, or chemistry from as exiting the first outlet valve.

20. The apparatus of claim 19, wherein the chemical ampoule is a sublimation ampoule, an evaporation ampoule, or a combination thereof.

* * * * *